(12) United States Patent
Liu et al.

(10) Patent No.: US 11,781,710 B2
(45) Date of Patent: Oct. 10, 2023

(54) ELECTRONIC SIGNBOARD AND WALL HANGING DEVICE

(71) Applicants: Beijing BOE Optoelectronics Technology Co., Ltd., Beijing (CN); BOE TECHNOLOGY GROUP CO., LTD., Beijing (CN)

(72) Inventors: Yanjun Liu, Beijing (CN); Qingqing Ma, Beijing (CN); Yinan Gao, Beijing (CN); Tianjiao Wang, Beijing (CN); Junpeng Han, Beijing (CN); Yin Yuan, Beijing (CN); Jinmiao Tang, Beijing (CN); Hui Sun, Beijing (CN); Bangcan Xue, Beijing (CN); Jia Meng, Beijing (CN); Tao Jia, Beijing (CN); Wenfeng Jin, Beijing (CN); Ming Zhai, Beijing (CN); Shuo Li, Beijing (CN); Liguang Deng, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 53 days.

(21) Appl. No.: 17/316,983

(22) Filed: May 11, 2021

(65) Prior Publication Data
US 2022/0065394 A1    Mar. 3, 2022

(30) Foreign Application Priority Data
Aug. 31, 2020   (CN) .......................... 202021863438.X (51) Int. Cl.
*F16M 13/02* (2006.01)
*G09F 9/30* (2006.01)
(Continued)

(52) U.S. Cl.
CPC ............. *F16M 13/02* (2013.01); *G02F 1/167* (2013.01); *G02F 1/16753* (2019.01); *G09F 9/30* (2013.01);
(Continued)

(58) Field of Classification Search
None
See application file for complete search history.

(56) References Cited

U.S. PATENT DOCUMENTS 5,100,098 A * 3/1992 Hawkins ............... G06F 1/1628
361/679.55
5,520,361 A * 5/1996 Lee ....................... G06F 1/1601
248/398
(Continued)

FOREIGN PATENT DOCUMENTS

CN     101944310 A     1/2011
CN     102411877 A     4/2012
(Continued)

OTHER PUBLICATIONS

China Patent Office, Novelty search report.
China Patent Office, First Office Action dated Mar. 3, 2021, for corresponding Chinese application 202021863438.X.

*Primary Examiner* — Xanthia C Cunningham
(74) *Attorney, Agent, or Firm* — HOUTTEMAN LAW LLC (57) ABSTRACT

Disclosed are an electronic signboard and a wall hanging device. The electronic signboard includes a display device and a wall hanging device. The display device is provided with a first fitting portion, and the wall hanging device is provided with a second fitting portion detachably connected to the first fitting portion. The wall hanging device is further provided a fixing surface via which the wall hanging device is fixed to a mounting base.

16 Claims, 7 Drawing Sheets

(51) Int. Cl.
  *H05K 5/02* (2006.01)
  *G02F 1/16753* (2019.01)
  *H05K 5/00* (2006.01)
  *G02F 1/167* (2019.01)

(52) U.S. Cl.
  CPC ......... *H05K 5/0013* (2013.01); *H05K 5/0017* (2013.01); *H05K 5/0204* (2013.01)

(56) References Cited

U.S. PATENT DOCUMENTS

| | | | | |
|---|---|---|---|---|
| 6,007,038 A * | 12/1999 | Han | ................... | F16M 11/2014 248/346.06 |
| 6,189,849 B1 * | 2/2001 | Sweere | ................ | F16M 11/30 248/295.11 |
| 6,233,138 B1 * | 5/2001 | Osgood | ................ | G06F 1/1681 248/920 |
| 6,366,453 B1 * | 4/2002 | Wang | ................ | H04N 5/64 361/796 |
| 7,068,497 B2 * | 6/2006 | Chu | ................... | F16M 11/2021 248/920 |
| 7,126,815 B2 * | 10/2006 | Hwang | ................. | G06F 1/1607 361/679.06 |
| 7,180,731 B2 * | 2/2007 | Titzler | ................. | G06F 1/1601 361/679.22 |
| 8,083,193 B2 * | 12/2011 | Matsui | ................ | F16M 11/041 248/222.51 |
| 8,297,571 B2 * | 10/2012 | Xue | ................. | F16M 11/10 248/220.22 |
| 8,348,206 B2 * | 1/2013 | Wang | ................ | F16M 11/10 248/176.1 |
| 8,960,627 B2 * | 2/2015 | Atallah | ................ | G06F 1/1601 248/371 |
| 9,042,092 B2 * | 5/2015 | Lu | ................. | F16M 11/041 361/679.29 |
| 9,134,758 B2 * | 9/2015 | Chen | ................. | G06F 1/1616 |
| 9,338,902 B2 * | 5/2016 | Liu | ................. | G06F 1/1601 |
| 2004/0047115 A1 * | 3/2004 | Helot | ................. | F16M 11/2021 361/679.06 |
| 2005/0051693 A1 * | 3/2005 | Chu | ................. | F16M 11/2021 248/371 |
| 2006/0238966 A1 * | 10/2006 | Sung | ................. | F16M 11/2057 361/679.05 |
| 2009/0206214 A1 * | 8/2009 | David | .................... | F16M 13/02 248/205.1 |
| 2010/0219303 A1 * | 9/2010 | Matsui | ................. | F16M 11/105 248/316.1 |
| 2012/0182277 A1 * | 7/2012 | Jeong | ................. | G06F 3/0412 345/207 |
| 2013/0026326 A1 * | 1/2013 | Atallah | ................. | F16M 11/10 248/371 |
| 2014/0185211 A1 * | 7/2014 | Chen | ................. | G06F 1/1616 361/679.02 |
| 2015/0138118 A1 * | 5/2015 | Liu | ................. | G09G 27/00 345/173 |
| 2015/0366090 A1 * | 12/2015 | You | ................. | G06F 1/166 248/686 |
| 2015/0382491 A1 * | 12/2015 | Ye | ................. | F16M 11/10 248/457 |
| 2016/0010793 A1 | 1/2016 | McCullough | | |
| 2016/0078789 A1 * | 3/2016 | Hattori | ................. | G09F 13/04 40/573 |
| 2016/0307477 A1 * | 10/2016 | Cox | ................. | G09F 19/228 |
| 2018/0063978 A1 * | 3/2018 | Kim | ................. | H05K 5/0234 |
| 2020/0174515 A1 * | 6/2020 | So | ................. | F16M 11/08 |

FOREIGN PATENT DOCUMENTS

| | | |
|---|---|---|
| CN | 102829292 A | 12/2012 |
| CN | 204254217 U | 4/2015 |
| CN | 106448572 A | 2/2017 |

\* cited by examiner

ELECTRONIC SIGNBOARD AND WALL HANGING DEVICE

CROSS-REFERENCE TO RELATED APPLICATION

The present application claims priority to Chinese Patent Application 202021863438.X filed with the China National Intellectual Property Administration on Aug. 31, 2020, the disclosure of which is incorporated herein by reference in its entirety.

TECHNICAL FIELD

The present disclosure relates to the field of display technologies, and particularly relates to an electronic signboard and a wall hanging device.

BACKGROUND

Electronic signboard has now obtained extensive applications, but general electronic signboards are mostly fixed signboards that are fixed to a wall or a door via a screw or a double-sided tape, bringing about some problems like difficulties in detachment, inconvenience in accessory (e.g., battery) exchange, and so on.

SUMMARY

To solve at least one of the problems in the related art, the present disclosure provides an electronic signboard and a wall hanging device.

In order to achieve the above objects, the present disclosure provides an electronic signboard, including a display device and a wall hanging device, wherein the display device is provided with a first fitting portion, the wall hanging device is provided with a second fitting portion detachably connected to the first fitting portion, and the wall hanging device is further provided a fixing surface via which the wall hanging device is fixed to a mounting base.

In some embodiments, the display device includes: a display screen, a rear shell and a protruding structure disposed on the rear shell, wherein the rear shell is disposed on a side facing away from a display side of the display screen, and the protruding structure is disposed on a side of the rear shell facing away from the display screen, and the wall hanging device includes: at least one mounting plate, the mounting plate and the protruding structure are configured to be located on the same side of the rear shell when the first fitting portion and the second fitting portion are coupled together, and the first fitting portion is disposed on the protruding structure, while the second fitting portion is disposed on the mounting plate.

In some embodiments, the first fitting portion is one of a guide groove and a guide strip, while the second fitting portion is the other of a guide groove and a guide strip, and the guide groove and the guide strip both extend in a height direction the electronic signboard.

In some embodiments, the guide groove is disposed on the mounting plate, the guide strip is disposed on the protruding structure, and the rear shell has a first surface that is facing away from the display screen and has a gap from the guide strip; and the guide groove is provided with an opening at a head end thereof, via which the guide strip extends into or out of the guide groove; and the guide groove is provided with a blocking wall at a tail end thereof for limiting and supporting the guide strip extending into the guide groove.

In some embodiments, the guide strip is provided with an abutting portion at a top end thereof for abutting against a top end of the mounting plate when the guide strip extends into the guide groove.

In some embodiments, a groove is disposed on a surface of the rear shell facing away from the display side of the display screen, and a mounting hole with a snap-fit assembly therein is disposed on the mounting plate, wherein the snap-fit assembly has an end protruding beyond an opening of the mounting hole and extending into the groove on the rear shell.

In some embodiments, the snap-fit assembly includes a snap-fit member being a bead, and an elastic member coupled to the snap-fit member.

In some embodiments, there are two mounting plates configured to be located on two opposite sides of the protruding structure when the first fitting portion and the second fitting portion are coupled together.

In some embodiments, the wall hanging device further includes: a cross beam to which the mounting plates are fixedly connected; bottom ends of the mounting plates are connected to the cross beam, and the cross beam is configured to support the display device when the first fitting portion and the second fitting portion are coupled together; or, the cross beam is connected to the two mounting plates at two ends, respectively, and the cross beam and the mounting plates are configured to be located on the same side of the rear shell facing away from the display screen when the first fitting portion and the second fitting portion are coupled together.

In some embodiments, the fixing surface is fixed to the mounting base by any one of an adhesive layer, a screw, and a magnetic member.

In some embodiments, the display device further includes: a front frame connected to the rear shell, and the display screen is fixed between the front frame and the rear shell.

In some embodiments, the front frame includes: a bezel portion and a shield portion connected to the bezel portion, wherein the bezel portion surrounds the display screen disposed between the shield portion and the rear shell, and the shield portion is located in an edge area of the display screen, and the display device further includes a cover plate fixed on a side of the shield portion facing away from the rear shell.

In some embodiments, the protruding structure and the rear shell enclose a battery compartment for receiving a battery.

In some embodiments, the display screen is an electronic ink screen.

In an embodiment of the present disclosure, there is further provided a wall hanging device, including: at least one mounting plate provided with a fitting portion; wherein the fitting portion on the mounting plate is a guide groove configured to be detachably connected to a guide strip on an external display device; or, the fitting portion on the mounting plate is a guide strip configured to be detachably connected to a guide groove on an external display device.

In some embodiments, the fitting portion on the mounting plate is a guide groove provided with an opening at a head end thereof, via which the guide strip on the display device extends into or out of the guide groove; and the guide groove is provided with a blocking wall at a tail end thereof for limiting and supporting the guide strip extending into the guide groove.

In some embodiments, a mounting hole with a snap-fit assembly therein is disposed on the mounting plate, wherein the snap-fit assembly has an end protruding beyond an opening of the mounting hole and configured to extend into the groove on the display device during mounting of the display device.

In some embodiments, the snap-fit assembly includes a snap-fit member being a bead, and an elastic member coupled to the snap-fit member.

In some embodiments, there are two mounting plates configured to be located on two sides of the protruding structure on the rear shell of the display device when the fitting portion is coupled with the guide groove or the guide strip on the display device.

In some embodiments, the wall hanging device further includes: a cross beam to which the mounting plates are fixedly connected; bottom ends of the mounting plates are connected to the cross beam, and the cross beam is configured to support the display device when the fitting portion is coupled with the guide groove or the guide strip on the display device. or, the cross beam is connected to the two mounting plates at two ends, respectively, and the cross beam and the mounting plates are configured to be located on the same side of the rear shell of the display device when the fitting portion is coupled with the guide groove or the guide strip on the display device.

BRIEF DESCRIPTION OF THE DRAWINGS

Accompanying drawings are provided for further understanding of this disclosure and constitute a part of the specification. Hereinafter, these drawings are intended to explain the disclosure together with the following specific embodiments, but should not be considered as a limitation of the disclosure. In the drawings.

DETAILED DESCRIPTION OF THE EMBODIMENTS

Hereinafter, specific embodiments of the present disclosure will be described with respect to the accompanying drawings. It should be understood that the specific embodiments as set forth herein are merely for the purpose of illustration and explanation of the disclosure and should not be constructed as a limitation thereof.

To make the objects, technical solutions and advantages of the disclosure clearer, the technical solutions in the embodiments of the disclosure will now be described clearly and completely with reference to the accompanying drawings of the embodiments of the disclosure. Obviously, the described embodiments are only a part, not all, of the embodiments of the disclosure. Based on the described embodiments of the disclosure, all the other embodiments obtained by those of ordinary skilled in the art without any creative labour fall into the protection scope of the disclosure.

The terminology used herein to describe embodiments of the disclosure is not intended to limit and/or define the scope of the disclosure. For example, technical or scientific terms used in the present disclosure are intended to have general meanings as understood by those of ordinary skill in the art, unless otherwise defined. It should be understood that the words "first", "second" and similar terms used in the present disclosure do not denote any order, quantity, or importance, but are used merely for distinguishing different components. The singular forms "a," "an," or "the" and similar referents do not denote a limitation of quantity, but rather denote the presence of at least one, unless the context clearly dictates otherwise. Words like "comprising" or "comprises" means that the element or item preceding the word includes elements or items that appear after the word or equivalents thereof, but does not exclude other elements or items. Words like "connected" or "coupled" are not restricted to physical or mechanical connections, but may include electrical connections, whether direct or indirect. Words like "upper", "lower", "left", "right" are merely used to indicate a relative positional relationship, and when an absolute position of the described object is changed, the relative positional relationship may also be changed accordingly.

Figure 1:
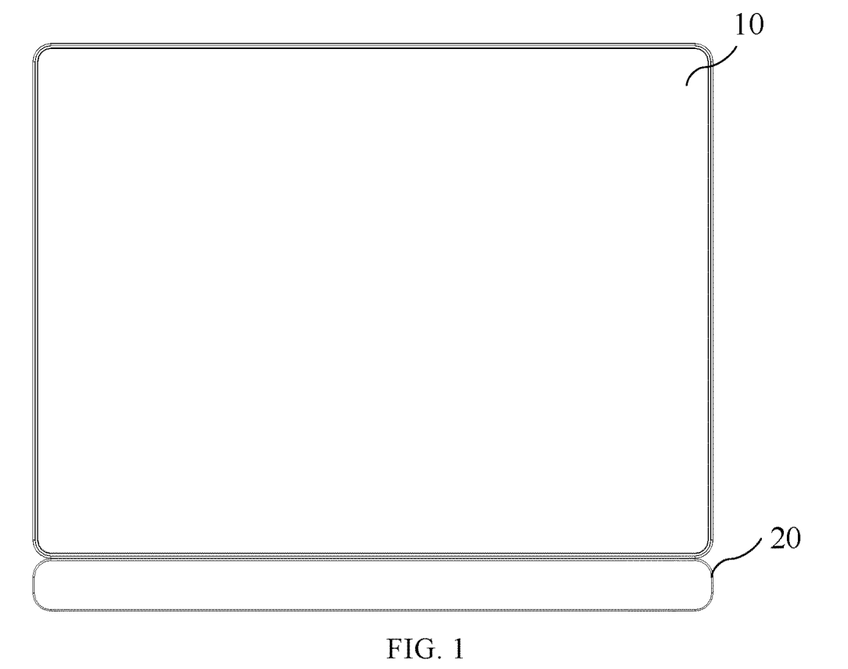
FIG. 1 is a front view of an electronic signboard provided in some embodiments of the present disclosure.
Figure 2:
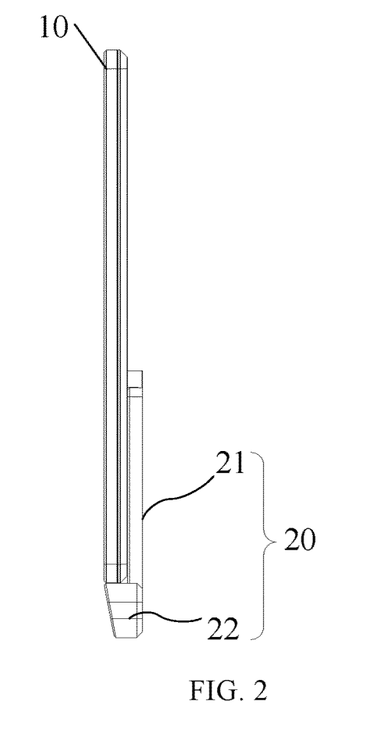
FIG. 2 is a side view of an electronic signboard provided in some embodiments of the present disclosure.
Figure 3:
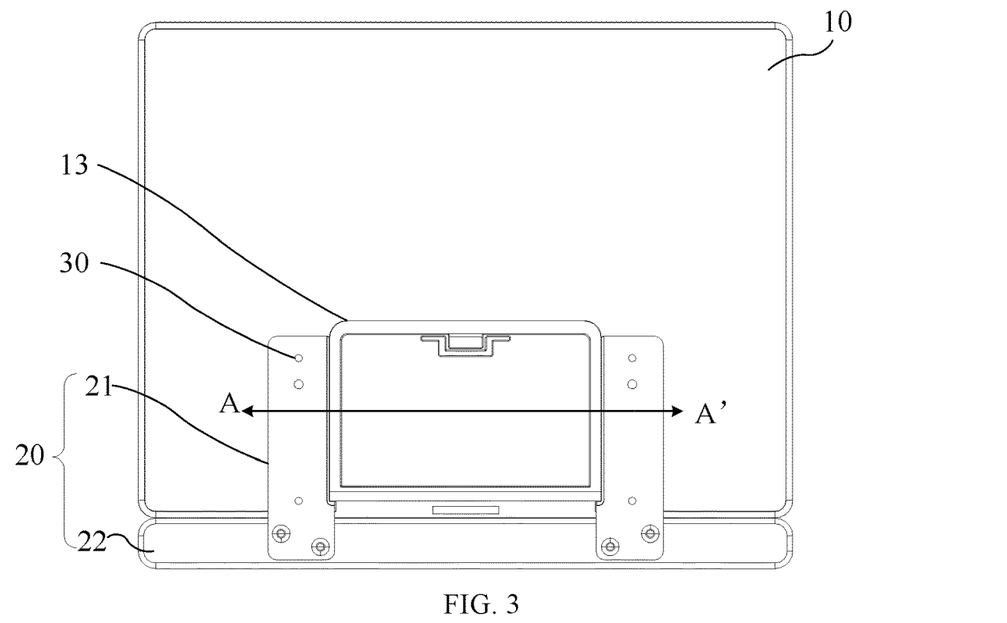
FIG. 3 is a rear view of an electronic signboard provided in some embodiments of the present disclosure.
Figure 4:
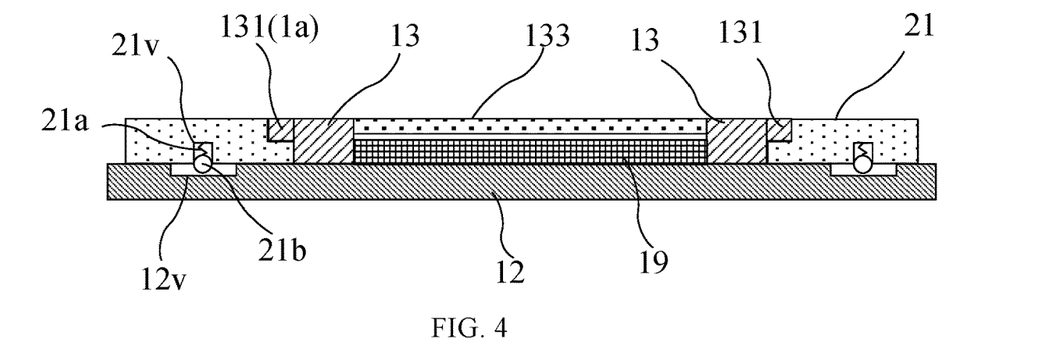
FIG. 4 is a sectional view taken along line A-A' of FIG. 3.
Figure 5:
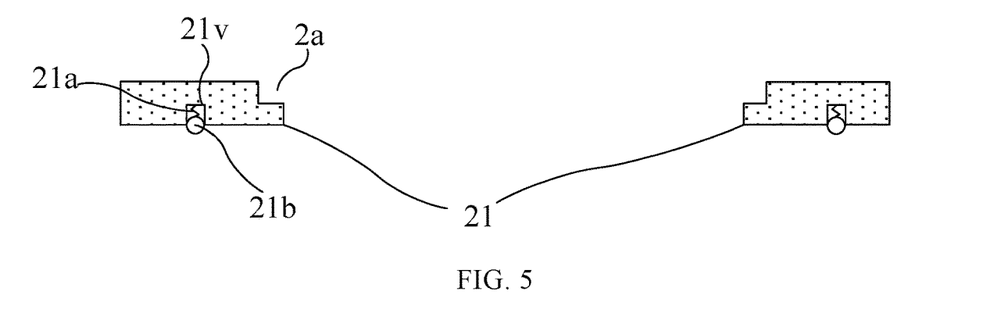
FIG. 5 is a cross-sectional view of the wall hanging device of FIG. 4.

FIG. 1 is a front view of an electronic signboard provided in some embodiments of the present disclosure, FIG. 2 is a side view of an electronic signboard provided in some embodiments of the present disclosure, FIG. 3 is a rear view of an electronic signboard provided in some embodiments of the present disclosure, FIG. 4 is a sectional view taken along line A-A' of FIG. 3, and FIG. 5 is a cross-sectional view of the wall hanging device of FIG. 4. In FIG. 4, the structure of the rear shell 12 on the side away from the mounting plate 21 is not shown. As shown in FIGS. 1 to 5, the electronic signboard includes: a display device 10 and a wall hanging device 20. The display device 10 is provided with a first fitting portion 1a, and the wall hanging device 20 is provided with a second fitting portion 2a detachably connected to the first fitting portion 1a. The wall hanging device 20 is further provided a fixing surface via which the wall hanging device 10 is fixed to a mounting base. For example, the mounting base is a wall, a door, a showcase, or the like.

In an embodiment of the present disclosure, the wall hanging device 20 may be fixed on the mounting base, while the first fitting portion 1a of the display device 10 is detachably connected to the second fitting portion 2a of the wall hanging device 20, so that when the electronic signboard needs to be detached or a battery of the display device 10 needs to be replaced, the first fitting portion 1a can be directly detached from the second fitting portion 2a to separate the display device 10 and the wall hanging device 20.

Figure 6:
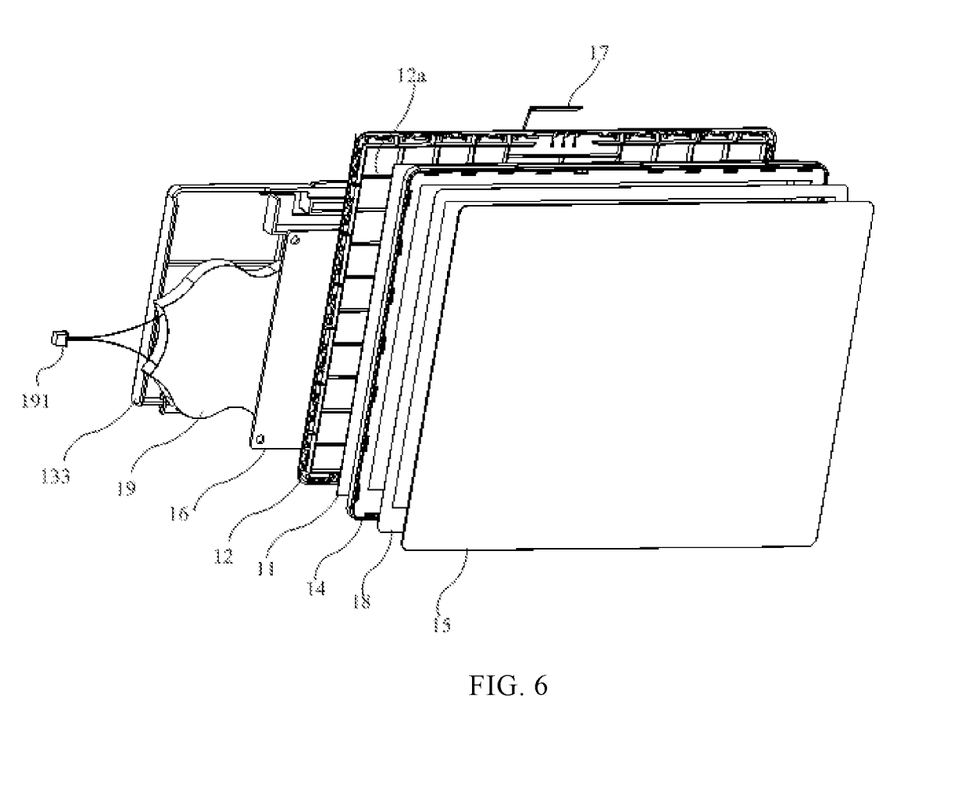
FIG. 6 is an exploded view of a display device provided in some embodiments of the present disclosure.

FIG. 6 is an exploded view of a display device provided in some embodiments of the present disclosure. As shown in FIG. 6, in some embodiments, the display device 10 includes a housing and a display screen 11 disposed in the housing. Optionally, the display screen 11 is an electronic ink screen, which can save power consumption compared to a liquid crystal display screen, thereby achieving an energy saving effect. The housing includes a front frame 14 and a rear shell 12 connected to the front frame 14 via, for example, a snap-fit connection. Optionally, a plurality of reinforcing ribs 12a are provided on a surface of the rear shell 12 facing the display screen 11 in a crisscross manner, thereby improving the strength of the rear shell 12. The display screen 11 has a display side, which is a side of the display screen 11 for displaying. The display screen 11 is fixed between the front frame 14 and the rear shell 12, and the rear shell 12 is located on a side of the display screen 11 facing away from the display side. In some embodiments, the display screen 11 may not include a backlight, such as a reflective liquid crystal display, a transflective liquid crystal display, or the like.

Figure 7:
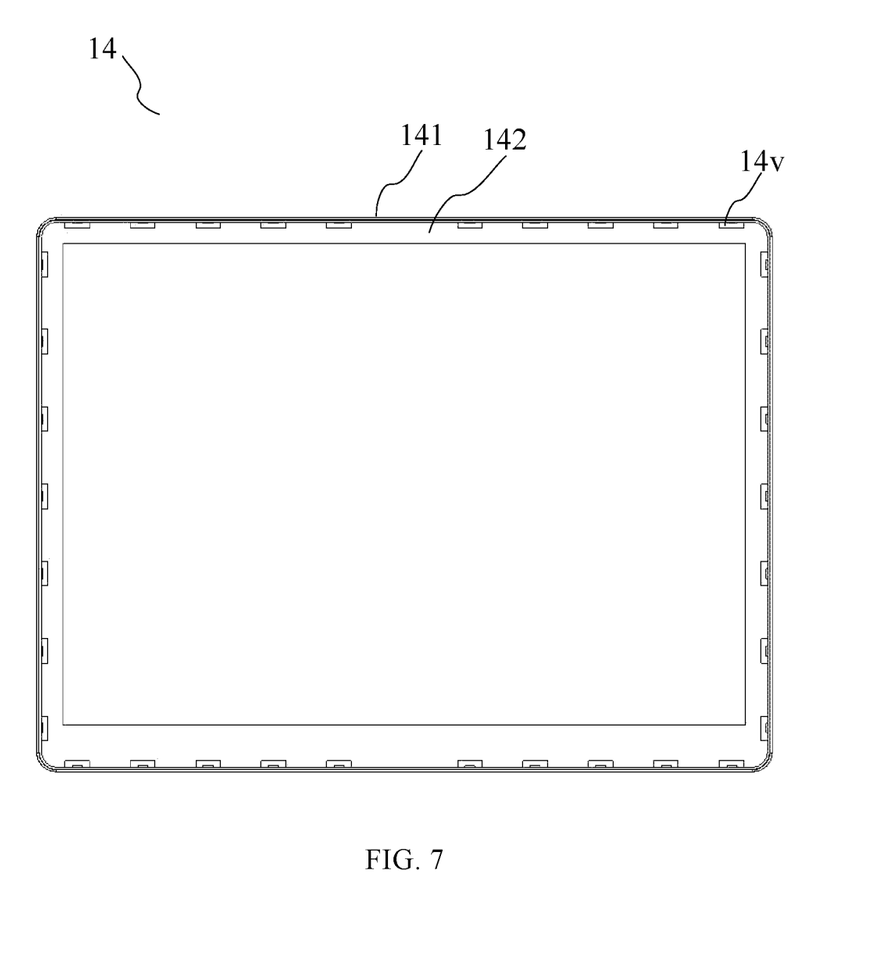
FIG. 7 is a front view of a front frame provided in some embodiments of the present disclosure.
Figure 8:
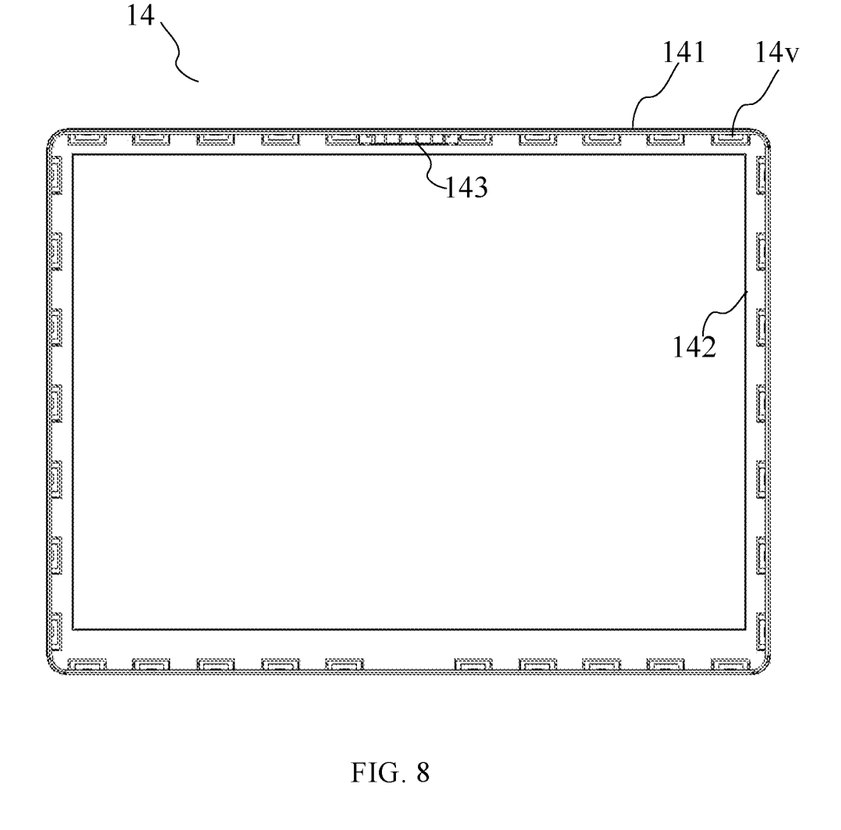
FIG. 8 is a rear view of a front frame provided in some embodiments of the present disclosure.

FIG. 7 is a front view of a front frame provided in some embodiments of the present disclosure, and FIG. 8 is a rear view of a front frame provided in some embodiments of the present disclosure. As shown in FIGS. 6 to 8, the front frame 14 includes: a bezel portion 141 and a shield portion 142 connected to the bezel portion 141. The bezel portion 141 surrounds the display screen 11 disposed between the shield portion 142 and the rear shell 12, and the shield portion 142 is located in an edge area of the display screen 11. For example, the edge area of the display screen 11 may be bonded to the shield portion 142 via an adhesive layer. The shield portion 142 is provided with a plurality of female fasteners 14v, while the rear shell 12 is provided with a plurality of male fasteners each engaged with the female fasteners 14v at one end, so that the front frame 14 is engaged with the rear shell 12.

As shown in FIG. 6, the display device 10 may further include a cover plate 15 fixed on a side of the shield portion 142 facing away from the rear shell 12, thereby protecting the display screen 11. The cover plate 15 is, for example, a glass cover plate or a flexible cover plate made of an organic material. Optionally, the cover plate 15 is bonded to the shield portion 142 via an adhesive material layer 18 such as a double-sided tape.

As shown in FIG. 6, the display device 10 may further include a driving circuit board 16 disposed between the display screen 11 and the rear shell 12 and electrically connected to the display screen 11 to supply a driving signal to the display screen 11. Optionally, the driving circuit board 16 is attached to the display screen 11 via an adhesive material such as a foam adhesive.

As shown in FIG. 6, the display device 10 may further include: an antenna 17 disposed between the shield portion 142 and the rear shell 12 and connected to the driving circuit board 16. The antenna 17 may receive a control command from a control terminal (e.g., a mobile phone), and transmit the control command to the driving circuit board 16 so that the driving circuit board 16 drives the display screen 11 to display a corresponding picture according to the control command. Optionally, as shown in FIG. 8, the shield portion 142 of the front frame 14 is provided with an antenna mounting portion 143. The antenna mounting portion 143 is located on a side of the shield portion 142 facing the rear shell 12, and the antenna 17 is fixed on the antenna mounting portion 143. For example, the antenna 17 is bonded to the antenna mounting portion 143 via a bonding material such as a double-sided tape.

A battery 19 is disposed on a side of the rear shell 12 facing away from the display screen 11 and is electrically connected to the driving circuit board 16.

In an embodiment of the present disclosure, as shown in FIGS. 3 and 4, a protruding structure 13 on the rear shell 12 encloses a battery compartment with the rear shell 12, and the protruding structure 13 may be a clip-shaped structure, a ring-shaped structure, or other irregular-shaped structures, which is not limited herein. The battery compartment is configured to accommodate a battery, which may be a battery pack consisting of a plurality of button batteries. The battery in the battery compartment is electrically connected to the driving circuit board 16 through a connector 191, and the rear shell 12 is provided with a through hole for the connector 191 to pass through. For example, the connector 191 is a plug that is connected to a socket on the driving circuit board 16 through the through hole. Further, a compartment cover 133 is disposed on a side of the battery facing away from the rear shell 12, and the compartment cover 133 is clamped with the protruding structure 13 (i.e., a sidewall of the battery compartment).

Figure 9:
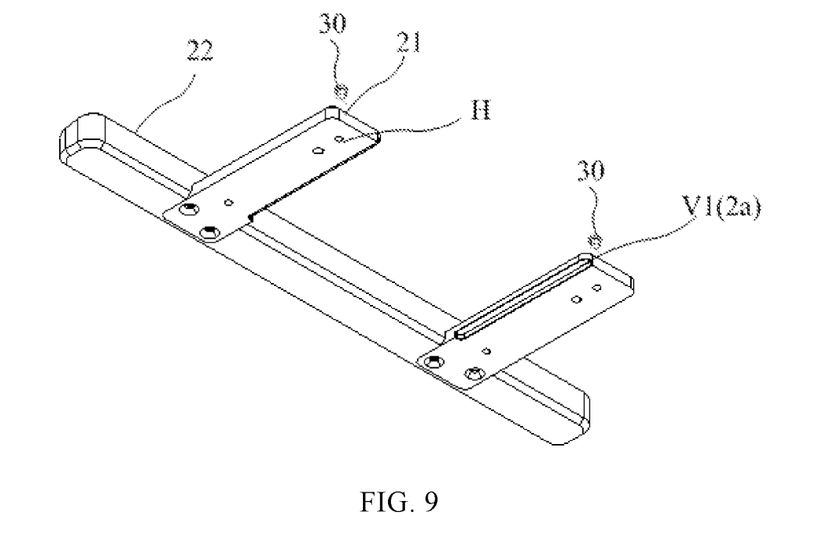
FIG. 9 is a perspective view of a wall hanging device provided in some embodiments of the present disclosure.
Figure 10:
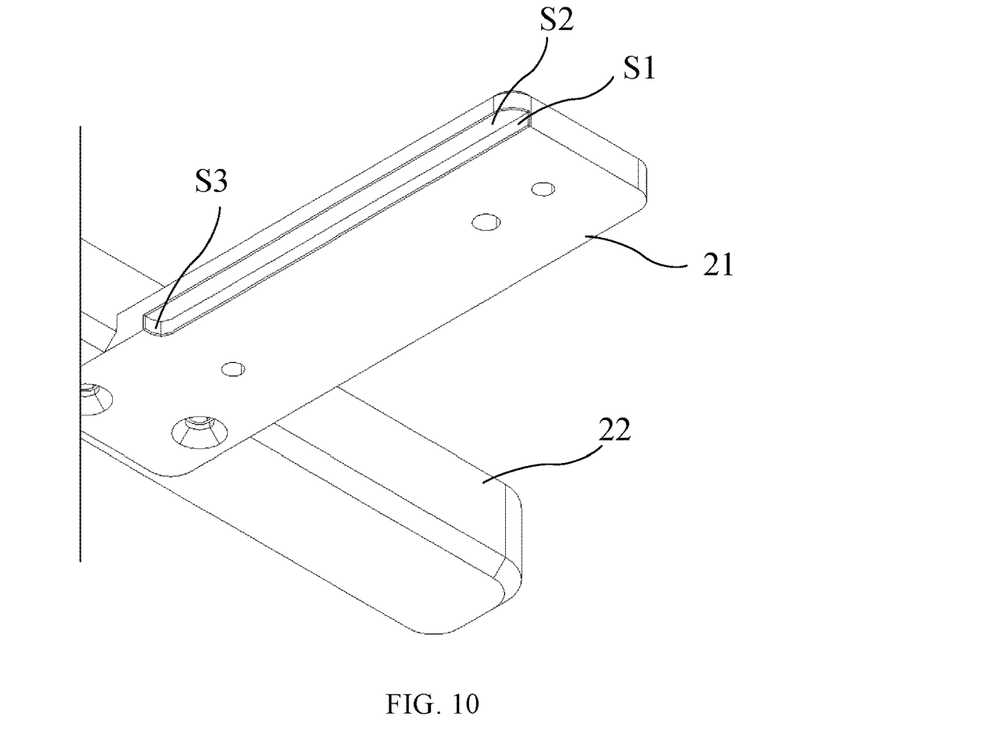
FIG. 10 is a partial schematic view of a wall hanging device provided in some embodiments of the present disclosure.
Figure 11:
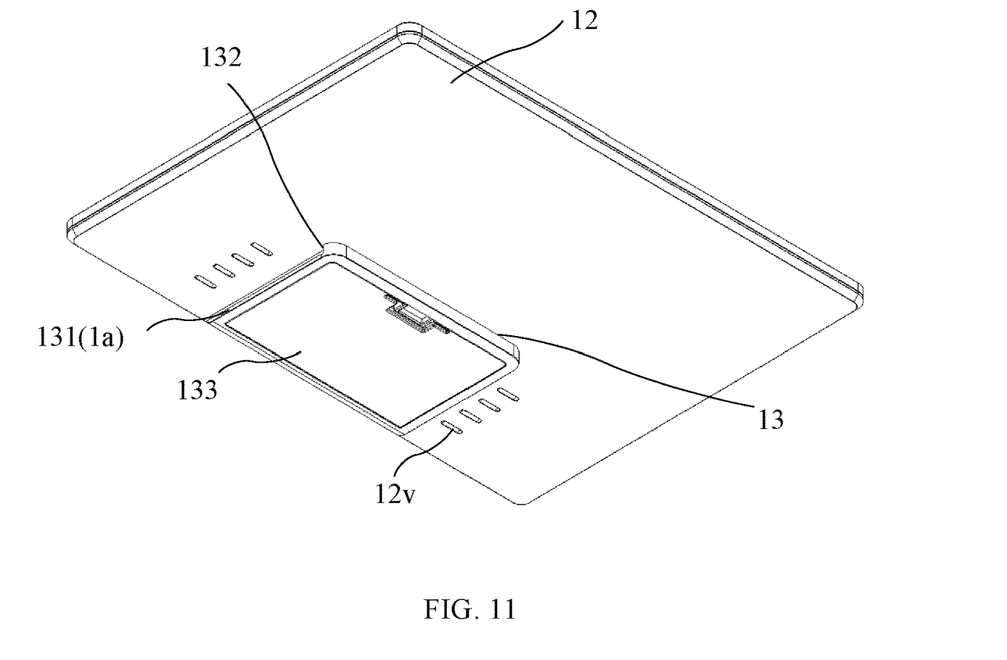
FIG. 11 is a perspective view of a display device provided in some embodiments of the present disclosure.
Figure 12:
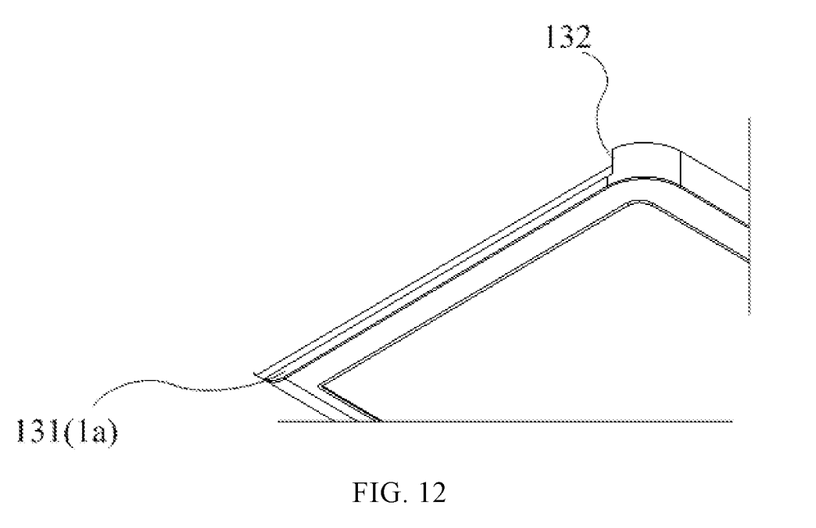
FIG. 12 is a partial schematic view of the protruding structure of FIG. 11.

FIG. 9 is a perspective view of a wall hanging device provided in some embodiments of the present disclosure, FIG. 10 is a partial schematic view of a wall hanging device provided in some embodiments of the present disclosure, FIG. 11 is a perspective view of a display device provided in some embodiments of the present disclosure, and FIG. 12 is a partial schematic view of the protruding structure of FIG. 11. As shown in FIGS. 9 to 12, the wall hanging device 20 includes: at least one mounting plate 21. The mounting plate 21 and the protruding structure 13 are configured to be located on the same side of the rear shell 12 when the first fitting portion 1a and the second fitting portion 2a are coupled together. The first fitting portion 1a is disposed on the protruding structure 13, and the second fitting portion 2a is disposed on the mounting plate 21. In some examples, there are two mounting plates 21 configured to be located on two opposite sides of the protruding structure 13 when the first fitting portion 1a and the second fitting portion 2a are coupled together.

In some examples, the first fitting portion 1a is a guide strip 131, and the second fitting portion 2a is a guide groove V1 along which the guide strip 131 is slidable. The guide groove V1 and the guide strip 131 may both extend along a height direction of the electronic signboard. It should be noted that the height direction of the electronic signboard refers to the height direction of the electronic signboard in normal use, i.e., the up-down direction in FIGS. 1 to 3. Obviously, in other examples, the first fitting portion 1a may be provided as a guide groove, and the second fitting portion 2a may be provided as a guide strip. The guide groove and the guide strip may both extend along a length direction (the left-right direction in FIG. 1) of the electronic signboard.

As shown in FIGS. 4 and 9 to 11, the guide groove V1 is disposed on the mounting plate 21, the guide strip 131 is disposed on the protruding structure 13, a surface of the rear shell 12 away from the display screen 11 is called a first surface, and a gap is provided between the guide strip 131 and the first surface of the rear shell 12. The guide groove V1 is provided with an opening at a head end thereof, via which the guide strip 131 extends into or out of the guide groove V1; and the guide groove V1 is provided with a blocking wall S3 at a tail end thereof for limiting and supporting the guide strip 131 extending into the guide groove V1, thereby supporting the protruding structure 13 as a whole. The head end of the guide groove V1 refers to a top end of the guide groove V1 when the electronic signboard is in a mounted state; and the tail end of the guide groove V1 refers to a bottom end of the guide groove V1 when the electronic signboard is in normal use.

As shown in FIG. 11, the guide strip 131 is provided with an abutting portion 132 at a top end thereof for abutting against a top end of the mounting plate 21 when the guide strip 131 extends into the guide groove V1. The top end of the mounting plate 21 (or the top end of the guide strip 121) refers to: a top end of the mounting plate 21 (or a top end of the guide strip 121) when the electronic signboard is in a mounted state.

In other examples, the abutting portion 132 in FIG. 11 may be omitted. In this case, the gap between the guide strip 131 and the first surface of the rear shell 12 is a vertically penetrating gap.

In one or more embodiments of the present disclosure, the mounting plate 21 has a mounting surface and a supporting surface opposite to the mounting surface. The supporting surface is a surface opposite to the rear shell 12, and the mounting surface is a surface opposite to the mounting base. In the embodiment shown in FIGS. 9 and 10, the guide groove V1 includes only a blocking wall S3, a first wall S1 and a second wall S2, i.e., no gap is provided between the guide groove V1 and a plane of the mounting surface. It should be noted that, however, in practical applications, a gap may be provided between the guide groove V1 and the plane of the mounting surface, and accordingly, a gap is provided between the guide strip 131 on the protruding structure 13 and a plane of the protruding structure 13 facing away from the rear shell 12.

It should be further noted that the above embodiment is illustrated taking the case where the guide strip 131 is provided on the protruding structure 13 and the guide groove V1 is provided on the mounting plate 21 as an example, but in practical applications, the guide strip 131 may be provided on the mounting plate 21, while the guide groove V1 may be provided on the protruding structure 13.

In some embodiments, as shown in FIGS. 4 and 11, a groove 12v is disposed on a surface of the rear shell 12 facing away from the display side of the display screen 11, and a mounting hole 21v with a snap-fit assembly therein is disposed on the mounting plate 21. The snap-fit assembly may include, for example, an elastic member 21a and a snap-fit member 21b coupled with the elastic member 21a. The snap-fit assembly has an end protruding beyond an opening of the mounting hole 21v and extending into the groove 12v on the rear shell 12. Optionally, a plurality of grooves 12v may be provided on the rear shell 12 at positions corresponding to each of the mounting plates 21, and each of the grooves 12v may have a strip shape and extend along an arrangement direction of the two mounting plates 21. When the display device 10 is assembled to or detached from the wall hanging device 20, the guide strip 131 slides along the guide groove V1 so that a part of the rear shell 12 without the groove 12v contacts and presses the snap-fit member 21b, thereby pressing the snap-fit member 21b into the mounting hole. When the rear shell 12 is moved until the groove 12v is aligned with the snap-fit member 21b, an end of the snap-fit member 21b extends into the opening of the mounting hole 21v and into the groove 12v on the rear shell 12 under an elastic action of the elastic member 21a. In this manner, the snap-fit member 21b and the groove 12v form a snap-fit locking structure, thereby preventing the guide strip 131 from easily falling out of the guide groove V1, and thus ensuring stable connection between the display device 10 and the wall hanging device 20.

Optionally, the elastic member 21a may employ a spring, a leaf spring, or the like. In order to facilitate arrangement of the elastic member 21a, in some examples, the mounting hole 21v is a blind hole, one end of the elastic member 21a is disposed on a bottom wall of the blind hole, and the other end is connected to the snap-fit member 21b. The snap-fit member 21b may have a cambered surface so that the rear shell 12 is prevented from being scratched by the snap-fit member 21b when the rear shell 12 contacts the snap-fit member 21b and moves relatively. Optionally, the snap-fit member 21b is a bead.

In some embodiments, as shown in FIGS. 1 to 3 and 9, the wall hanging device 20 may further include a cross beam 22 to which the mounting plates 21 are fixedly connected. Bottom ends 21 of the mounting plates 21 are connected to the cross beam 22, and the display device 10 is supported on the cross beam 22 when the first fitting portion and the second fitting portion are coupled together. Obviously, in other embodiments, the cross beam 22 may be connected to the two mounting plates 21 disposed at both sides of the protruding structure 13 at two ends, respectively, and the cross beam 22 and the mounting plates 21 are located on the same side (back side) of the rear shell 12 facing away from the display screen 11. In this manner, the cross beam 22 may be hidden on the back side of the display device 10 during use.

The connection manner of the mounting plates 21 and the cross beam 22 is not limited in detail herein. For example, the mounting plates 21 may be connected to the cross beam 22 via a connector such as a screw 30.

When the wall hanging device 20 includes the cross beam 22, a connector such as a screw 30 may be disposed on the cross beam 22 or the mounting plates 21, so as to fix the wall hanging device 20 on the mounting base, and thus fix the electronic signboard on the mounting base as a whole. Obviously, in other embodiments, the wall hanging device 20 may not include the cross beam 22. In this case, a connector such as a screw 30 may be disposed on the mounting plates 21, so as to fix the mounting plates 21 on the mounting base, and thus fix the electronic signboard on the mounting base as a whole.

In some embodiments, the fixing surface may be fixed to the mounting base by any one of an adhesive layer, a screw, and a magnetic member. For example, a surface of the cross beam 22 and/or the mounting plate 21 facing the mounting base is a fixing surface, and an adhesive layer such as a double-sided tape is disposed on the fixing surface. For another example, a screw hole H is provided on the cross beam 22 and/or the mounting plate 21, and the screw 30 is mounted on the mounting base via the screw hole H. For another example, a magnetic member such as a magnet is provided on a surface of the beam 22 and/or inside the cross beam 22 so that the electronic signboard is fixed on the mounting base with an iron layer surface via magnetic attraction.

In an embodiment of the present disclosure, there is further provided a wall hanging device, including at least one mounting plate provided with a fitting portion. The fitting portion on the mounting plate is a guide groove configured to be detachably connected to a guide strip on an external display device; or, the fitting portion on the mounting plate is a guide strip configured to be detachably connected to a guide groove on an external display device.

Optionally, there are two mounting plates configured to be located on two opposite sides of the protruding structure on the rear shell of the display device when the fitting portion is coupled with the guide strip or the guide groove on the display device.

In some embodiments, as shown in FIGS. 9 to 11, the fitting portion on the mounting plate 21 is a guide groove V1 provided with an opening at a head end thereof, via which the guide strip 131 on an external display device extends into or out of the guide groove V1. The guide groove V1 is provided with a blocking wall S3 at a tail end thereof for limiting and supporting the guide strip 131 extending into the guide groove V1.

In some embodiments, as shown in FIG. 5, a mounting hole 21v with a snap-fit member 21b therein is disposed on the mounting plate 21. The snap-fit member 21b has an end protruding beyond an opening of the mounting hole 21v and extending into the groove on the external display device. In the mounting hole 21v, an elastic member 21a connected to the snap-fit member 21b is further provided, and the snap-fit member 21b is a bead.

In some embodiments, as described above, the wall hanging device further includes: a cross beam 22 to which the mounting plates 21 are fixedly connected. For example, bottom ends 21 of the mounting plates 21 are connected to the cross beam 22 so that the display device is supported on the cross beam 22 when the fitting portion is coupled with the guide groove or guide strip on the display device. or, the cross beam 22 is connected to the two mounting plates 21 at two ends, respectively, and the cross beam 22 and the mounting plates 21 are configured to be located on the same side of the rear shell of the display device when the fitting portion is coupled with the guide groove or the guide strip on the display device.

It will be appreciated that the above implementations are merely exemplary implementations for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. An electronic signboard, comprising a display device and a wall hanging device, wherein the display device is provided with a first fitting portion, the wall hanging device is provided with a second fitting portion detachably connected to the first fitting portion, and the wall hanging device is further provided a fixing surface via which the wall hanging device is fixed to a mounting base,
wherein the display device comprises: a display screen, a rear shell and a protruding structure disposed on the rear shell, wherein the rear shell is disposed on a side facing away from a display side of the display screen, and the protruding structure is disposed on a side of the rear shell facing away from the display screen, and
the wall hanging device comprises: two mounting plates, the mounting plate and the protruding structure are configured to be located on the same side of the rear shell when the first fitting portion and the second fitting portion are coupled together, and
the first fitting portion is disposed on the protruding structure, while the second fitting portion is disposed on the mounting plate,
wherein the first fitting portion is one of a guide groove and a guide strip, while the second fitting portion is the other of a guide groove and a guide strip, and
the guide groove and the guide strip both extend in a height direction the electronic signboard,
wherein the two mounting plates are configured to be located on two opposite sides of the protruding structure when the first fitting portion and the second fitting portion are coupled together.

2. The electronic signboard according to claim 1, wherein the guide groove is disposed on the mounting plate, the guide strip is disposed on the protruding structure, and the rear shell has a first surface that is facing away from the display screen and has a gap from the guide strip; and
the guide groove is provided with an opening at a head end thereof, via which the guide strip extends into or out of the guide groove; and the guide groove is provided with a blocking wall at a tail end thereof for limiting and supporting the guide strip extending into the guide groove.

3. The electronic signboard according to claim 1, wherein the guide strip is provided with an abutting portion at a top end thereof for abutting against a top end of the mounting plate when the guide strip extends into the guide groove.

4. The electronic signboard according to claim 1, wherein a groove is disposed on a surface of the rear shell facing away from the display side of the display screen, and a mounting hole with a snap-fit assembly therein is disposed on the mounting plate, wherein the snap-fit assembly has an end protruding beyond an opening of the mounting hole and extending into the groove on the rear shell.

5. The electronic signboard according to claim 4, wherein the snap-fit assembly comprises a snap-fit member being a bead, and an elastic member coupled to the snap-fit member.

6. The electronic signboard according to claim 1, wherein the wall hanging device further comprises: a cross beam to which the mounting plates are fixedly connected;
bottom ends of the mounting plates are connected to the cross beam, and the cross beam is configured to support the display device when the first fitting portion and the second fitting portion are coupled together; or,
the cross beam is connected to the two mounting plates at two ends, respectively, and the cross beam and the mounting plates are configured to be located on the same side of the rear shell facing away from the display screen when the first fitting portion and the second fitting portion are coupled together.

7. The electronic signboard according to claim 1, wherein the fixing surface is fixed to the mounting base by any one of an adhesive layer, a screw, and a magnetic member.

8. The electronic signboard according to claim 1, wherein the display device further comprises: a front frame connected to the rear shell, and the display screen is fixed between the front frame and the rear shell.

9. The electronic signboard according to claim 8, wherein the front frame comprises: a bezel portion and a shield portion connected to the bezel portion, wherein the bezel portion surrounds the display screen disposed between the shield portion and the rear shell, and the shield portion is located in an edge area of the display screen, and
the display device further comprises a cover plate fixed on a side of the shield portion facing away from the rear shell.

10. The electronic signboard according to claim 1, wherein the protruding structure and the rear shell enclose a battery compartment for receiving a battery.

11. The electronic signboard according to claim 1, wherein the display screen is an electronic ink screen.

12. A wall hanging device, comprising: two mounting plates each provided with a fitting portion; wherein
the fitting portion on the mounting plate is a guide groove configured to be detachably connected to a guide strip on an external display device, the guide groove and the guide strip both extend in a height direction the external display device; or, the fitting portion on the mounting plate is a guide strip configured to be detachably connected to a guide groove on an external display device, the guide groove and the guide strip both extend in a height direction the external display device, wherein the two mounting plates are configured to be located on two sides of a protruding structure on a rear shell of the external display device when the fitting portion is coupled with the guide groove or the guide strip on the external display device.

13. The wall hanging device according to claim 12, wherein the fitting portion on the mounting plate is a guide groove provided with an opening at a head end thereof, via which the guide strip on the display device extends into or out of the guide groove; and the guide groove is provided with a blocking wall at a tail end thereof for limiting and supporting the guide strip extending into the guide groove.

14. The wall hanging device according to claim 13, wherein a mounting hole with a snap-fit assembly therein is disposed on the mounting plate, wherein the snap-fit assembly has an end protruding beyond an opening of the mounting hole and configured to extend into the groove on the display device during mounting of the display device.

15. The wall hanging device according to claim 14, wherein the snap-fit assembly comprises a snap-fit member being a bead, and an elastic member coupled to the snap-fit member.

16. The wall hanging device according to claim 12, wherein the wall hanging device further comprises: a cross beam to which the mounting plates are fixedly connected;

bottom ends of the mounting plates are connected to the cross beam, and the cross beam is configured to support the display device when the fitting portion is coupled with the guide groove or the guide strip on the display device, or, the cross beam is connected to the two mounting plates at two ends, respectively, and the cross beam and the mounting plates are configured to be located on the same side of the rear shell of the display device when the fitting portion is coupled with the guide groove or the guide strip on the display device.

\* \* \* \* \*